United States Patent
Fahimi et al.

(10) Patent No.: US 9,655,262 B2
(45) Date of Patent: May 16, 2017

(54) HEADER SUB-ASSEMBLIES

(71) Applicant: Rosemount Aerospace Inc., Burnsville, MN (US)

(72) Inventors: Saeed Fahimi, Bloomington, MN (US); Kevin Groeneveld, Chanhassen, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 274 days.

(21) Appl. No.: 14/256,651

(22) Filed: Apr. 18, 2014

(65) Prior Publication Data

US 2015/0302955 A1    Oct. 22, 2015

(51) Int. Cl.
| | | |
|---|---|---|
| *H01L 29/20* | (2006.01) | |
| *H05K 5/06* | (2006.01) | |
| *H05K 5/00* | (2006.01) | |
| *G01L 19/14* | (2006.01) | |
| *G01L 19/04* | (2006.01) | |

(52) U.S. Cl.
CPC .............. *H05K 5/066* (2013.01); *G01L 19/04* (2013.01); *G01L 19/145* (2013.01); *H05K 5/0095* (2013.01)

(58) Field of Classification Search
None
See application file for complete search history.

(56) References Cited

U.S. PATENT DOCUMENTS

| | | | |
|---|---|---|---|
| 4,168,394 A * | 9/1979 | Yuey | H01B 17/30 174/11 R |
| 4,406,993 A | 9/1983 | Kurtz | |
| 5,823,811 A * | 10/1998 | Blanchfield | H01R 13/5025 439/274 |
| 6,550,337 B1 * | 4/2003 | Wagner | G01L 9/0042 73/715 |

(Continued)

FOREIGN PATENT DOCUMENTS

WO    WO-01/53789 A1    7/2001

OTHER PUBLICATIONS

Extended European Search Report dated Aug. 31, 2015, issued on corresponding European Patent Application No. 15163832.7 (7 pages).

*Primary Examiner* — David Sample
*Assistant Examiner* — Seth Dumbris
(74) *Attorney, Agent, or Firm* — Locke Lord LLP; Scott D. Wofsy; Alicia J. Carroll

(57) ABSTRACT

A dielectric header sub-assembly includes a header body with opposed first and second surfaces and a side wall. The first and second surfaces define a header axis extending therebetween. The side wall extends from the first surface to the second surface. The second surface includes a tapered portion. A dielectric header sub-assembly includes a bore. The bore extends from the first surface to the second surface. A first bore opening of the bore proximate to the first surface is greater in area than a second bore opening of the bore proximate the second surface. A method of assembling a (Continued)

header sub-assembly includes inserting an electrical connector into a bore of a header body, applying an active braze filler material into the bore and applying heat to braze the active braze filler material to the header body and the electrical connector.

6 Claims, 3 Drawing Sheets

(56) References Cited

U.S. PATENT DOCUMENTS

| | | | |
|---|---|---|---|
| 6,623,612 B2* | 9/2003 | Shirai | G01N 27/4077 204/424 |
| 7,880,127 B2* | 2/2011 | Garris | H01J 31/26 250/208.1 |
| 8,292,651 B1 | 10/2012 | Lakeman et al. | |
| 2005/0039624 A1* | 2/2005 | Furusawa | F42B 3/103 102/202.12 |

* cited by examiner

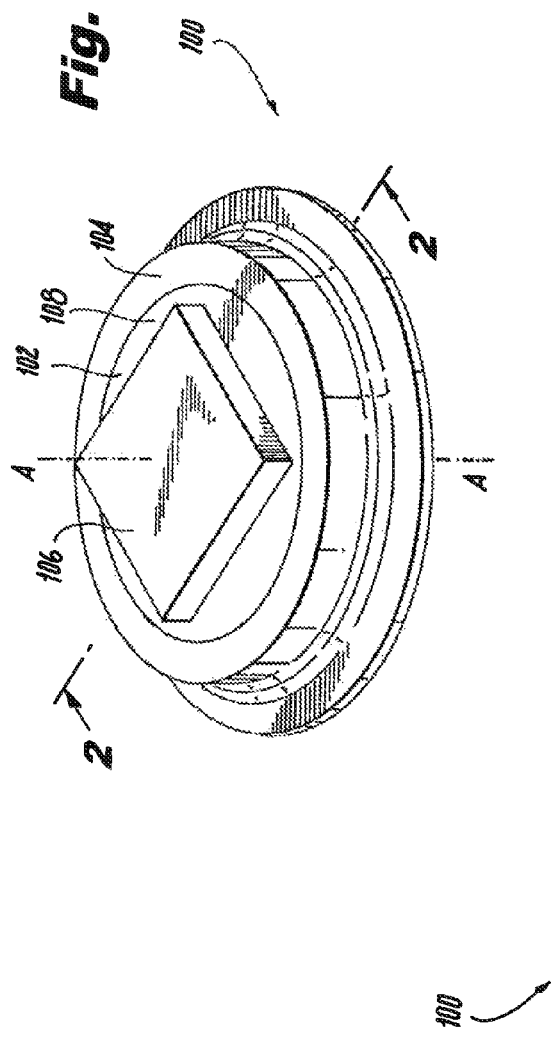
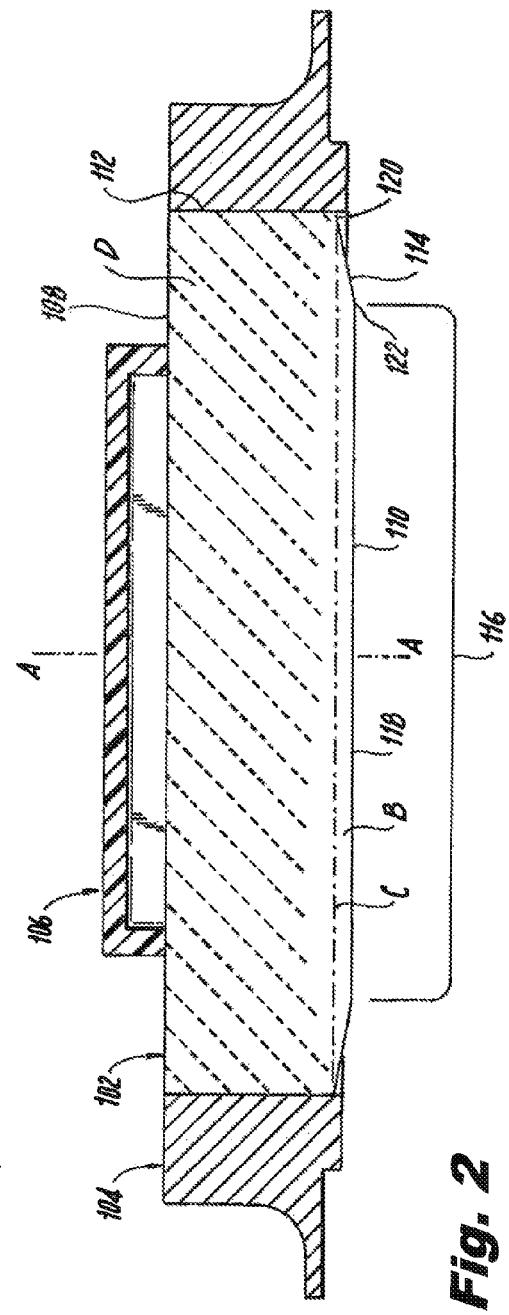

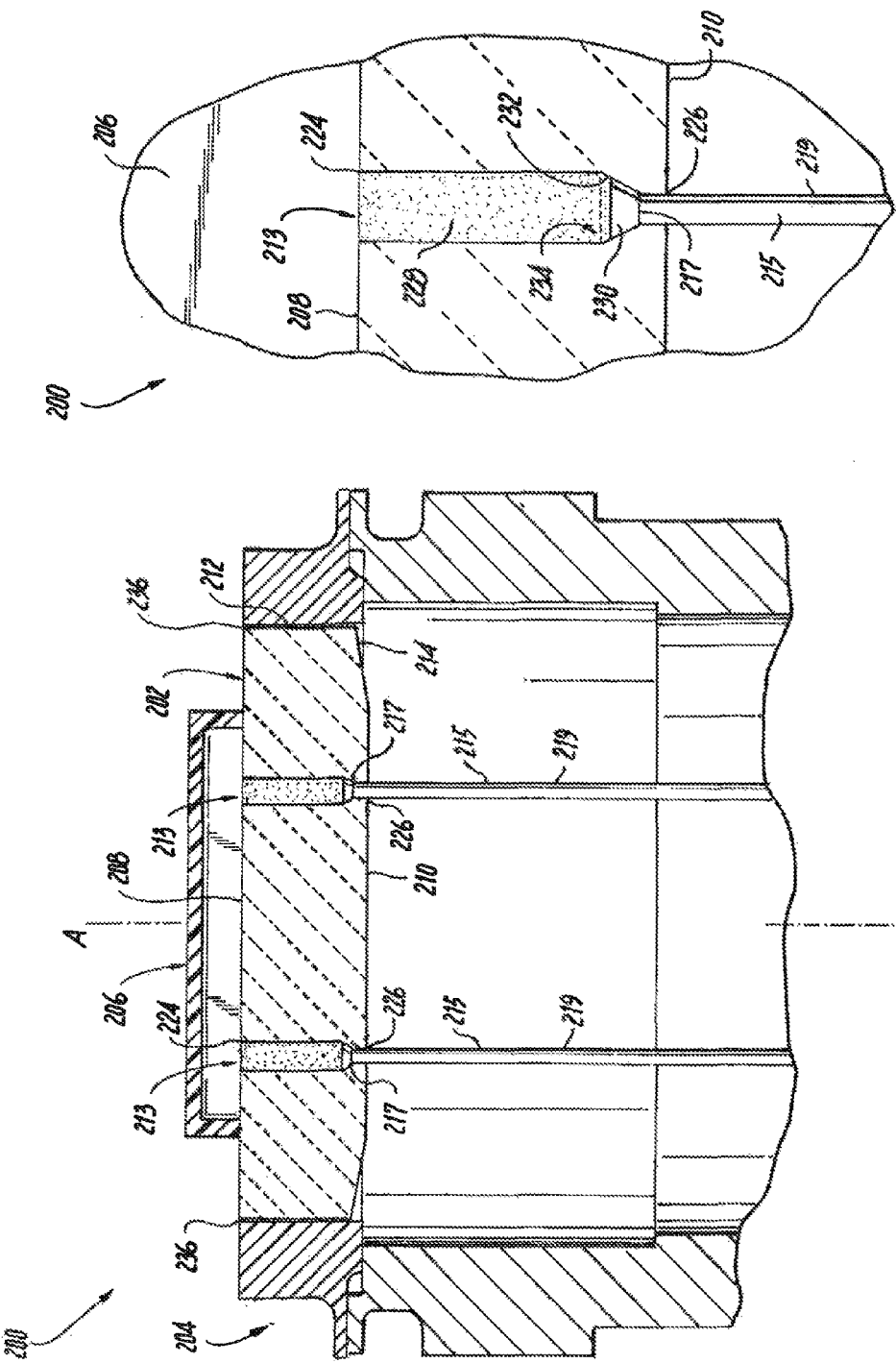

HEADER SUB-ASSEMBLIES

BACKGROUND OF THE INVENTION

1. Field of the Invention

The present disclosure relates to header sub-assemblies, and more particularly to header sub-assemblies suitable for high-temperature applications.

2. Description of Related Art

There are a variety of dielectric header sub-assemblies for mounting a semiconductor die, e.g. a sensor. Traditionally, the header sub-assemblies include a ceramic insulating header body containing electrical connectors and a metal ring surrounding the outer diameter of the header body for support and for hermetic isolation of the sensor environment from the completed package. For high temperature applications, the header body is brazed to the metal ring and to the electrical connectors at a high temperature. Compressive stresses imposed on the header body by the metal ring upon cooling from the braze temperature can cause the surface of the header where the die is mounted to distort, e.g. in the concave and/or convex direction.

One solution for the surface deformation is to grind the concave and/or convex surface flat at room temperature after brazing. While this solution alleviates the curvature at room temperature, deformities can still occur during in-service temperature cycling, thereby exerting stresses on the sensor attachment to the header surface and causing issues with die performance. For example, micro-cracks can occur in the attachment between the die and the ceramic header body.

In addition, cracking can occur between the electrical connector and the header body along the braze joint due to differences in thermal expansion. Further, in order to braze a metallic part to a ceramic part, the ceramic part is typically coated with a thick film ink, e.g. molybdenum and/or tungsten. These metals oxidize at 400° C. and are not always suitable for certain applications. Sputtered metallic films are also an option for brazing a metallic part to a ceramic part. Sputtered metallic films can be used so that the braze filler can wet the surface of the ceramic by wicking along the joint via capillary action. This can be difficult and time consuming when brazing, for example, small pin holes, such as those used for the electrical connectors.

Such conventional methods and systems have generally been considered satisfactory for their intended purpose. However, there is still a need in the art for header sub-assemblies that mitigate deformities and cracking due to thermal stresses and increase ease of manufacturing. The present invention provides a solution for these problems.

SUMMARY OF THE INVENTION

A dielectric header sub-assembly includes a header body with opposed first and second surfaces and a side wall. The first and second surfaces define a header axis extending therebetween. The side wall extends from the first surface to the second surface. The second surface includes a tapered portion.

In accordance with certain embodiments, the tapered portion can be on an outer periphery of the second surface. The tapered portion can be tapered from a first end proximate the side wall to a second end proximate a non-tapered portion of the second surface. The first surface and at least a portion the non-tapered portion of the second surface can be substantially parallel to each other over a range of temperatures, e.g. from 22° C. to 1045° C. The surface area of the first surface can be greater than the surface area of a non-tapered portion of the second surface. The first surface and/or a non-tapered portion of the second surface can have a circular shape. The side wall can have a cylindrical shape. The tapered portion can have a frustoconical shape.

It is contemplated that a portion of the header body proximate the second surface can include a cross-section with a trapezoidal shape. A portion of the header body proximate the first surface can include a cross-section in line with the header axis with a rectangular shape. The portion of the header body having a cross-section with a trapezoidal shape can be defined between the second surface and a line parallel to the first surface. The line can be substantially orthogonal to the header axis. The header body can include a ceramic material. The dielectric header sub-assembly can incorporate a die or other sensing element mounted to the first surface of the header body. The header sub-assembly can also include a ring mounted around the periphery of the header body for hermetically isolating the die. A portion of the second surface can protrude beyond the ring in an axial direction.

A dielectric header sub-assembly includes a header body, as described above, and a bore. The bore extends from the first surface to the second surface. A first bore opening of the bore proximate to the first surface is greater in area than a second bore opening of the bore proximate the second surface.

It is contemplated that the dielectric header sub-assembly can further include an electrical connector including a first end thereof mounted within the bore. A second end of the electrical connector can project from the bore opening. An active braze filler material can be disposed within the bore for electrically connecting a die and the electrical connector and for maintaining hermeticity across the bore. The first end of the electrical connector can include a head mated with an interior surface of the bore such that the first end of the electrical connector can be retained within the bore, while a remaining portion can project from the bore. The first end of the electrical connector can be between the first and second surfaces of the header body. The bore can include a tapered portion proximate the second surface tapering downward toward the second surface.

A method of assembling a header sub-assembly includes inserting an electrical connector into a bore of a header body, applying an active braze filler material into the bore and applying heat to braze the active braze filler material to the header body and the electrical connector.

In accordance with certain embodiments, the method can include applying a die to a first surface of the header body so the active braze filler material can be in electrical contact with electrical contacts of the die. Applying heat to the active braze filler material can include wetting an interior bore surface in the header body, adhering the electrical connector to an interior bore surface, and/or hermetically sealing the electrical connector within the header body. The method can include applying a braze material to a side wall of the header body and mounting a ring around the header body and the braze material. The braze material can be between the side wall of the header body and the ring. Applying heat to the active braze filler material can include applying heat to flow the braze material between the side wall of the header body and the ring and hermetically sealing the ring to the header body.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 1 is a perspective view of an exemplary embodiment of a header sub-assembly constructed in accordance with the present disclosure, showing a header body, a die and a ring;

FIG. 2 is a cross-sectional side-elevation view of the header sub-assembly of FIG. 1, showing the ring and a tapered portion of the header body;

FIG. 3 is a cross-sectional side-elevation view of a header sub-assembly constructed in accordance with the present disclosure, showing a header body with bores and electrical connectors disposed within the bores;

FIG. 4 is a cross-sectional side-elevation view of a portion of the header sub-assembly of FIG. 3, showing the tapered portion of one of the bores and the active braze filler material.

DETAILED DESCRIPTION OF THE PREFERRED EMBODIMENTS

Figure 5:
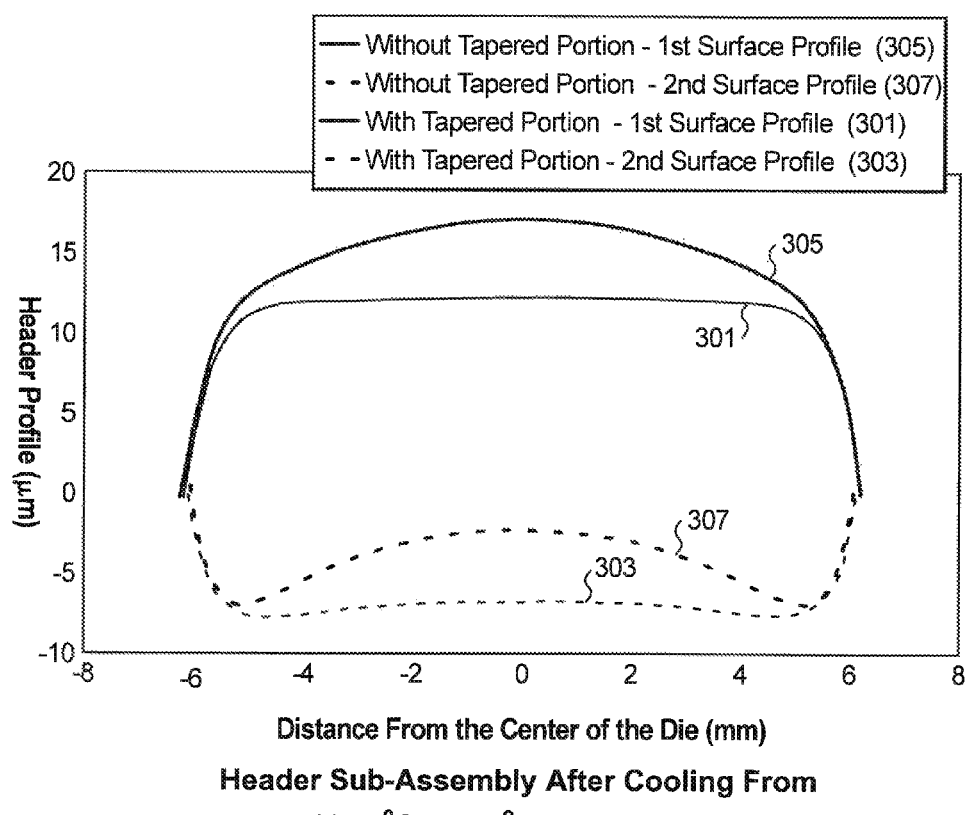
FIG. 5 is a graph of header profile versus distance from the center of the die for traditional header sub-assemblies and for the header sub-assembly of FIG. 1 under the distorting effects of thermal stress.

Reference will now be made to the drawings wherein like reference numerals identify similar structural features or aspects of the subject disclosure. For purposes of explanation and illustration, and not limitation, a perspective view of an exemplary embodiment of a dielectric header sub-assembly constructed in accordance with the present disclosure is shown in FIG. 1 and is designated generally by reference character 100. Other embodiments of dielectric header sub-assemblies constructed in accordance with the present disclosure, or aspects thereof, are provided in FIGS. 2-5, as will be described.

As shown in FIG. 1, a dielectric header sub-assembly 100 includes a header body 102, and a ring 104. In addition, a die 106 is mounted to a first surface 108 of header body 102. Those skilled in the art will readily appreciate that die 106 can be any suitable sensing element. Ring 104 is mounted around the periphery of header body 102 for hermetically isolating a sensor environment provided in the completed sensor package. Those skilled in the art will also readily appreciate that header body 102 can be made from a ceramic material or any other suitable insulating material and that ring 104 can be made from any suitable metallic material.

As shown in FIG. 2, header body 102 has a second surface 110 opposing first surface 108 and a side wall 112. First and second surfaces 108 and 110, respectively, define a header axis A extending therebetween. Side wall 112 extends from first surface 108 to second surface 110. Second surface 110 includes a tapered portion 114. It is contemplated that tapered portion 114 can include a frustoconical portion, a step or steps, a curved portion and/or any other suitable tapering transition between side wall 112 and a non-tapered portion 118 of second surface 110. Tapered portion 114 of second surface 110 allows first surface 108 to remain substantially planar, e.g. flat, over the operating temperature range, e.g. from 22° C. to 1045° C., as described in further detail below. Those skilled in the art will readily appreciate that with first surface 108 substantially flat, the bond between die 106 is not overly stressed and bending of die 106 is reduced, therein reducing degradation of die 106 performance as compared with traditional header sub-assemblies. In addition, those skilled in the art will readily appreciate that the size of non-tapered portion 118 of second surface 110 can vary depending on the shape and size of tapered portion 114. For example, if tapered portion is a curved portion that forms a dome-like second surface 110, second surface 110 may not include a non-tapered portion 118 or may include a very small non-tapered portion.

With continued reference to FIG. 2, a portion 116 of second surface 110 protrudes beyond ring 104 in an axial direction, e.g. downward along header axis A as oriented in FIG. 2. First surface 108 and at least a portion of non-tapered portion 118 of second surface 110 are parallel to each other over a range of temperatures, for example, temperatures ranging from 22° C. to 1045° C. The perimeters of first surface 108 and non-tapered portion 118 of second surface 110 each have a circular shape. The surface area of first surface 108 is greater than the surface area of a non-tapered portion 118 of second surface 110. Those skilled in the art will readily appreciate that the perimeters of non-tapered portion 118 of second surface 110 and/or first surface 108 can have a variety of shapes, such as square, rectangle, elliptical or the like. It is also contemplated that the perimeters of non-tapered portion 118 of second surface 110 and first surface 108 can have different shapes from one another. Those skilled in the art will readily appreciate that side wall 112 and tapered portion 114 can vary in shape and dimension to accommodate for the different shapes of non-tapered portion 118 of second surface 110 and first surface 108.

Tapered portion 114 is on an outer periphery of second surface 110. Tapered portion 114 is tapered from a first end 120 proximate side wall 112 to a second end 122 proximate non-tapered portion 118 of second surface 110. Tapered portion 114 has a frustoconical shape. Side wall 112 has a cylindrical shape. Those skilled in the art will readily appreciate that while tapered portion 114 and side wall 112 are shown as having frustoconical and cylindrical shapes, respectively, there are a variety of suitable shapes for side wall 112 and tapered portion 114. For example, side wall 112 could have also have a frustoconical shape, or any other suitable circular or elliptical shape. A portion of header body 102 proximate second surface 110 includes a cross-section B with a trapezoidal shape. Cross-section B with a trapezoidal shape is defined between second surface 110 and a line C, e.g. the dashed line in FIG. 2, parallel to first surface 108. Line C is substantially orthogonal to header axis A. A portion of header body 102 proximate first surface 108 includes a cross-section D with a rectangular shape. Cross-section D with a rectangular shape is defined between first surface 108, sidewall 112, and line C.

Now with reference to FIG. 3, a header sub-assembly 200, similar to header sub-assembly 100, includes a header body 202 with bores 213. Header sub-assembly 200 includes electrical connectors 215. First and second surfaces 208 and 210, respectively, define a header axis A therebetween. Bore 213 extends from first surface 208 to second surface 210. A first bore opening 224 proximate to first surface 208 is greater in area than a second bore opening 226 proximate second surface 210. Each electrical connector 215 has a first end 217 thereof mounted within bore 213. Second ends 219 of each electrical connector 215 project from second bore opening 226. First ends 217 of each electrical connector 215 are between first and second surfaces 208 and 210, respectively, of header body 202. Header sub-assembly 200 includes a braze material 236 between a side wall 212 of header body 202 and a ring 204. Those skilled in the art will readily appreciate that braze material 236 between side wall 212 of header body 202 and a ring 204 can also be included in header sub-assembly 100. It is also contemplated that header sub-assembly 100 can include bores, e.g. bores 213, and electrical connectors, e.g. electrical connectors 215. Those skilled in the art will readily appreciate that a given header sub-assembly can include any suitable number of bores 213 and/or electrical connectors 215. It is also contemplated that bores 213 can have a variety of configurations within header body 202.

As shown in FIG. 4, each bore 213 includes a tapered portion 232 proximate second surface 210 tapering downward toward second surface 210. First end 217 of each electrical connector 215 includes a head 230 mated with an interior surface 234 of its respective bore 213 such that first end 217 of electrical connector 215 is retained within bore 213, while a remaining portion, e.g. second end 219, projects from bore 213. Those skilled in the art will readily appreciate that tapered portion 232 can have a variety of shapes in order to mate with head 230 of electrical connector 215. For example, heads 230 can be a variety of styles such as a countersunk style, flat style, brad style, and the like. Therefore, tapered portion 232 can be made to accommodate for these suitable head styles. It is contemplated that at least a portion of electrical connector 215 can be made from a variety of metallic materials able to withstand the high temperature braze and operating conditions, e.g. ranging from 600° C. and greater. For example, at least a portion of electrical connector 215 can include Inconel® 625, available from Special Metals Corporation, Huntington, W. Va., or the like.

With continued reference to FIG. 4, header sub-assembly 200 includes an active braze filler material 228 disposed within each bore 213 for electrically connecting electrical contacts of a die, e.g. die 106, with each respective electrical connector 215 and for maintaining hermeticity across bore 213. Those skilled in the art will readily appreciate that active braze filler material 236 acts to wet interior surface 234 of its respective bore 213 and, when heat is applied, acts to braze header body 202 to electrical connectors 215, therein reducing the steps from the typical assembly process, because metallization or sputtering is not required.

Now with reference to FIG. 5, axial deformations of a header body with a tapered portion, e.g. header bodies 102 and 202, and a traditional header body without a tapered portion are presented for comparison. Measurements were obtained using finite element analysis after cooling from a braze temperature of 1045° C. to 22° C. A first surface, e.g. first surface 108 or 208 as distorted by thermal stress, represented graphically by a substantially linear solid line 301, better maintains its flatness in its in its central region by an order of magnitude when compared to a first surface of a traditional header body represented graphically by a substantially convex solid line 305. A second surface, e.g. second surface 110 and 210, represented graphically by a substantially linear dashed line 303, also better maintains its flatness in its central region by an order of magnitude when compared to a second surface of a traditional header body represented graphically by a substantially concave dashed line 307. Those skilled in the art will readily appreciate that bending moments imposed on the header body by the non-uniform radial loads exerted during cooling by the metal ring as it shrinks, tend to bow traditional header bodies convex up. The added material, e.g. in the central region of the second surfaces 110 or 210, modifies this distortion leading to a flat translation of the first surface upward with minimal convex up bowing.

A method of assembling a header sub-assembly, e.g. header sub-assemblies 100 and 200, includes inserting an electrical connector, e.g. electrical connector 215, into a bore, e.g. bore 213, of a header body, e.g. header bodies 102 and 202, applying an active braze filler material, e.g. active braze filler material 228, into the bore and applying heat to braze the active braze filler material to the header body and the electrical connectors.

The method also includes applying a die, e.g. die 106, to a first surface of the header body so the active braze filler material is in electrical contact with the electrical contacts of the die. Applying heat to the active braze filler material includes wetting an interior bore surface, e.g. interior bore surface 234, in the header body, adhering the electrical connector to an interior bore surface, and hermetically sealing the electrical connector within the header body. Those skilled in the art will readily appreciate that the active braze filler material does not require the interior surfaces of the bores in the header body to be metallized or sputtered with a metal film. The active braze filler material uses active metals, for example titanium, to wet the interior surfaces of the bores allowing the electrical connectors to braze to it. For example, the active braze filler material can be TiCuNi®, available from The Morgan Crucible Company PLC, Windsor, Berkshire, England.

The method also includes applying a braze material, e.g. braze material 236, to a side wall, e.g. side wall 112 and 212, and mounting a ring, e.g. ring 104 and 204, around the header body and the braze material so the braze material is between the side wall and the ring. The braze material may be in the form of a paste, powder, foil, or any other suitable medium. Applying heat to the active braze filler material includes applying heat to flow the braze material between the side wall of the header body and the ring, therein hermetically sealing the ring to the header body. Those skilled in the art will readily appreciate that this allows for the braze material between the header body and the ring to be brazed at the same time as the active braze filler material.

The methods and systems of the present disclosure, as described above and shown in the drawings, provide for a dielectric header sub-assembly with superior properties including reduced deformation, increased operability at high temperatures and increased ease of manufacturing. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A dielectric header sub-assembly comprising:
   a header body including opposed first and second surfaces defining a header axis extending therebetween, a side wall extending from the first surface to the second surface, wherein the second surface includes a tapered portion,
   and a sensor die mounted to the first surface of the header body opposite of the second surface, wherein the surface area of the first surface is greater than the surface area of a non-tapered portion of the second surface.

2. A dielectric header sub-assembly as recited in claim 1, wherein the tapered portion is on an outer periphery of the second surface.

3. A dielectric header sub-assembly as recited in claim 1, wherein the tapered portion is tapered from a first end proximate the side wall to a second end proximate a non-tapered portion of the second surface, wherein the first surface and at least a portion of the non-tapered portion the second surface are substantially parallel to each other over temperatures ranging from 22° C. to 1045° C.

4. A dielectric header sub-assembly as recited in claim 1, wherein a portion of the header body having a cross-section with a trapezoidal shape is defined between the second surface, and a line parallel to the first surface.

5. A dielectric header sub-assembly as recited in claim 1, further comprising a ring mounted around the periphery of the header body for hermetically isolating the sensor die.

6. A dielectric header sub-assembly as recited in claim 5, wherein a portion of the second surface protrudes beyond the ring in an axial direction.

\* \* \* \* \*